United States Patent
Tamba et al.

[11] Patent Number: 5,457,412
[45] Date of Patent: Oct. 10, 1995

[54] SEMICONDUCTOR INTEGRATED CIRCUIT DEVICE INCLUDING INPUT CIRCUITRY TO PERMIT OPERATION OF A BI-CMOS MEMORY WITH ECL LEVEL INPUT SIGNALS

[75] Inventors: Nobuo Tamba, Ohme; Masanori Odaka, Kodaira, both of Japan; Toshiro Hiramoto, Menlo Park, Calif.; Masayuki Ohayashi; Kayoko Saito, both of Hamura, Japan

[73] Assignee: Hitachi, Ltd., Tokyo, Japan

[21] Appl. No.: 149,935

[22] Filed: Nov. 10, 1993

[30] Foreign Application Priority Data

Nov. 17, 1992 [JP] Japan ................................. 4-330933

[51] Int. Cl.⁶ ...................... H03K 19/0175; H03K 19/08
[52] U.S. Cl. ............................... 326/66; 326/18; 326/108
[58] Field of Search ..................... 307/475, 443, 307/455, 446, 463; 365/230.06; 326/64, 66, 126, 110, 105, 108, 17–18

[56] References Cited

U.S. PATENT DOCUMENTS

| | | | |
|---|---|---|---|
| 4,853,899 | 8/1989 | Kitsukawa et al. | 307/475 |
| 4,937,480 | 6/1990 | Higuchi et al. | 307/446 |
| 5,027,323 | 6/1991 | Miyamoto et al. | 307/446 |
| 5,042,010 | 8/1991 | Ogiue et al. | 365/230.06 |
| 5,255,225 | 10/1993 | Nambu et al. | 365/174 |

FOREIGN PATENT DOCUMENTS 3-152798  6/1991  Japan.

OTHER PUBLICATIONS

Suzuki et al. "High Speed SRAMs". IEEE International Solid–State Circuits Conference, 1989. pp. 32–33 and 281.

Primary Examiner—Edward P. Westin
Assistant Examiner—Jon Santamauro
Attorney, Agent, or Firm—Antonelli, Terry, Stout & Kraus

[57] ABSTRACT

A semiconductor integrated circuit device is provided for permitting operation of a CMOS or BiCMOS memory with ECL level input signals, in which operating speed is increased and power consumption is reduced.

Input signals of ECL levels are received by an input buffer for amplifying the input signals to an output signal level within a range where differential transistors of the input buffer operate in an unsaturation region. The output signal of the input buffer is supplied to a CMOS circuit or Bi-CMOS circuit which is operated by both an operating voltage having a first-stage smaller absolute value than that of the operating voltage of the input buffer and the ground potential of the circuit. This first stage CMOS or BiCMOS circuit also includes an arrangement to further amplify the received signals to provide further level conversion.

Since both the input buffer and the first-stage CMOS or Bi-CMOS circuit perform signal transmission and level conversions, high-speed operation and low power consumption can be achieved by a simple structure.

9 Claims, 8 Drawing Sheets

$VSS = VOL - Vth$
$VEM = VSS \sim VSS - Vth = VOL - 2Vth$

SEMICONDUCTOR INTEGRATED CIRCUIT DEVICE INCLUDING INPUT CIRCUITRY TO PERMIT OPERATION OF A BI-CMOS MEMORY WITH ECL LEVEL INPUT SIGNALS

BACKGROUND OF THE INVENTION

The present invention relates to a semiconductor integrated circuit device and, more particularly, to a technology which is effective in application to a static RAM (Random Access Memory) having a Bi-CMOS structure (i.e., a compound circuit of bipolar type transistors and a CMOS (Complementary Metal Oxide Semiconductor) circuit) having an ECL (Emitter Coupled Logic) interface.

There is a static RAM having the Bi-CMOS structure (Complementary Metal Oxide Semiconductor) which uses an ECL circuit as its input/output circuit while aiming at a high density and a power reduction by using memory cells comprising complementary metal oxide semiconductor field effect transistors (hereinafter referred to as CMOS circuits). A static RAM of this Bi-CMOS structure is described on pp. 32–33 and 281 of ISSCC Digest of Technical Papers, February 1989. This static RAM requires a level converter for converting an ECL level to a CMOS level. A high speed is intended in a device disclosed in Japanese Patent Laid-Open No. 152798/1991 by omitting the level converter. Another ECL-CMOS level converter is also disclosed in Japanese Patent Laid-open No. 276385/ 1992, laid-open on Oct. 1, 1992 (corresponding to U.S. patent application Ser. No. 07/845,557, filed on Mar. 4, 1992), now U.S. Pat. No. 4,255,225.

SUMMARY OF THE INVENTION

In order to omit the level converter, according to the disclosure of Japanese Patent Laid-open No. 152798/1991, an input buffer for receiving ECL levels has its output signal amplified to a high level H of −0.8 V and a low level of −2.8 V. Therefore, a differential circuit for receiving the ECL levels between −0.8 V and −1.6 V uses a mid point voltage of −1.2 V as a reference voltage VBB. This makes it necessary for the differential transistor circuit to produce an output signal of a low level of −2 V, so that the transistors to be turned on operate in a saturation region, resulting in a low-speed operation of the input buffer.

In order to prevent the transistors from saturating, it has been considered to shift and drop the levels of input signals in the differential transistor circuit composing the input buffer. In this case, the levels of signals to be inputted to the differential transistor circuit are shifted from a level of −0.8 V to 1.6 V to a level of −1.6 V to −2.4 V by providing an emitter-follower circuit receiving the input signals of the ECL levels. As a result, the reference voltage VBB can be reduced to −2.0 V. Even by this small level shift, however, the forward voltage is applied to the base and collector of each differential transistor, so that the transistor cannot be prevented from saturating. In order to maintain the high speed of the ECL circuit in the input buffer, therefore, the level shift has to be increased, for example, by using a two-stage emitter-follower circuit.

Even if a two-stage emitter-follower circuit is provided as described above, a level shifter is necessary though the level converter can be eliminated. Even if this level shifter is added, the expected high speed operation cannot be attained and, furthermore, the current dissipation increases. Moreover, if the ECL level is shifted as described above, the emitter voltage of the differential transistors have to be −3.2 V or less for the input level of −2.4 V in the differential transistor circuit. Therefore, in a logic structure having differential transistor circuits connected in cascade so as to construct a latch on the ECL circuit side, the emitter potential of the lower differential transistor has to be at about −4 V. If the operating voltage of a constant current source to be connected thereto is considered, the lower limit of the operating voltage has to be at about −4.5 V at the lowest. This raises a problem that the operating lower limit voltage on the ECL circuit side is restricted.

In the circuit of the aforementioned laid-open patent publication, power source voltages VSS and VDD are used as the operating voltages of the CMOS circuit or the Bi-CMOS circuit acting as a word driver. According to this structure, if a ground potential of the circuit such as VCC is used as the potential of an n-type well region where a p-channel MOSFET is formed, a back bias is applied because the source potential of the p-channel MOSFET is the VDD such as −0.8 V. Consequently a threshold voltage is increased due to the body effect and the operating speed is decreased. If the reference potential VDD of the circuit is supplied to the n-type well region so as to eliminate the influence of that body effect, there arises a troublesome problem that a latch-up is caused if the isolation from the VCC is not well achieved.

An object of the present invention is to provide a semiconductor integrated circuit device whose operating speed is increased and whose power consumption is reduced by a simple structure.

The aforementioned and other objects and novel features of the present invention will become apparent from the description to be made in the following discussion with reference to the accompanying drawings.

A summary of representative example of the invention to be disclosed herein will be briefly described in the following. Specifically, input signals at ECL levels are received by using an input buffer for amplifying output signal levels within a range where differential transistors operates in an unsaturation region and are supplied to a CMOS circuit or Bi-CMOS circuit which is operated by both an operating voltage having a smaller absolute value than that of the operating voltage of the input buffer and the ground potential of the circuit.

By the above-described means, both the input buffer and the first-stage CMOS or Bi-CMOS circuit receiving the output signals of the input buffer perform signal transmission and the level conversion, so that the high-speed operation and the low power consumption can be achieved by a simple structure.

PREFERRED EMBODIMENTS

Figure 1:
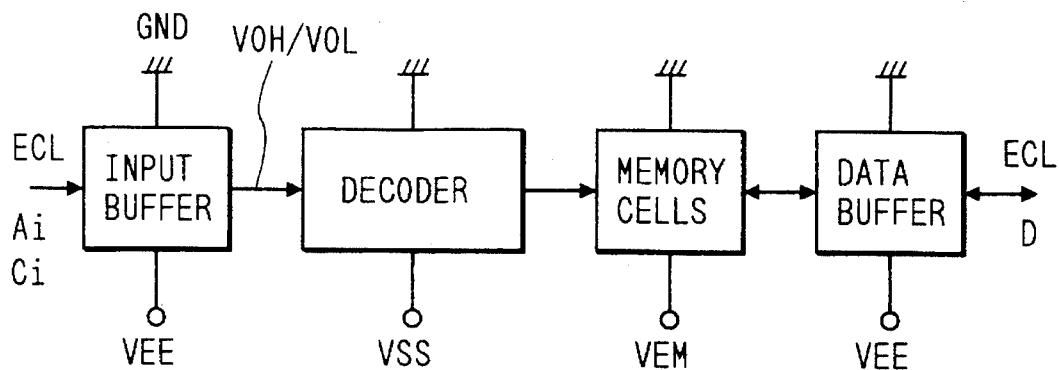
FIG. 1 is a schematic block diagram showing an embodiment of static RAM to which the present invention is adapted.

FIG. 1 is a schematic block diagram showing an embodiment of static RAM (Random Access Memory) to which the present invention is applied. In this embodiment, there are shown the individual circuits of signal transmission paths, taking up one of the memory cells. The individual circuit blocks of FIG. 1 are fabricated on a semiconductor substrate of monocrystalline silicon by a well-known Bi-CMOS circuit fabrication technology.

An address signal Ai and a control signal Ci of the ECL levels are supplied to the input buffer. This input buffer takes in the input signals of the ECL levels and amplifies them to supply address signals to the decoder. The control signal is supplied to a not-shown control circuit so that it is used to set operation modes such as a write-in/read-out operation. The decoder decodes the address signals to produce memory cell selecting signals.

In the write-in mode, the write-in signals of the ECL levels inputted through a data terminal D are taken in through the data buffer for the selected memory cell so that their levels are amplified and the amplified signals are transmitted to the memory cell. In the read-out mode, the level of the read-out signal from the selected memory cell is changed to the ECL level by the data buffer and outputted from the data terminal D. Thus, the data buffer includes a data input circuit having the write-in circuit and a data output circuit having a preamplifier and a sense amplifier.

The input buffer is operated by both the ground potential GND of the circuit and a power supply voltage corresponding to the operating voltage of the ECL (Emitter Coupled Logic) circuit. On the other hand, the decoder and the memory cell are operated by internal voltages VSS and VEM whose absolute values are reduced. These internal voltages VSS and VEM are determined by the output signals VOH/VOL of the input buffer. Specifically, the voltage VSS has a smaller absolute value than VOL-Vth (Vth designate the threshold voltage of the MOSFET). Likewise, the voltage VEM has a smaller absolute value than VSS to VSS-Vth (or VSS-2 Vth).

Figure 2:
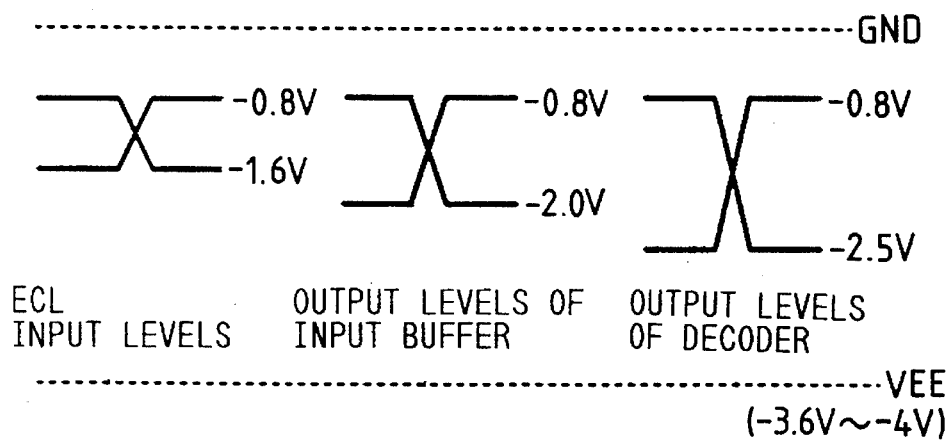
FIG. 2 is a waveform chart showing an embodiment of the signal levels of the individual circuit blocks of FIG. 1.

FIG. 2 is a waveform chart showing an embodiment of the signal levels of the aforementioned individual circuit blocks. The high/low ECL input levels are −0.8 V/−1.6 V. The high level VOH of the output signal of the input buffer is −0.8 V like the ECL high level. On the contrary, the low level VOL is increased to −2.0 V in its absolute value. This is because a reference voltage VBB of the ECL level is −1.2 V so that the collector potential of differential transistors in the input buffer is the same potential of −1.2 V as the aforementioned base potential thereby to retain the operations of the differential transistors in unsaturation regions. The signal VOL as low as −2.0 V can be achieved by outputting the output signals of the differential transistors through the emitter-follower circuit.

In correspondence with the aforementioned low level VOL, the decoder operating voltage VSS is set to −2.5 V, although not especially limited thereto. As a result, in the CMOS circuit (Complementary MOS circuit) constituting the decoder, n-channel MOSFETs (Metal Oxide Semiconductor Field Effect Transistors) can be turned off even when their threshold voltage is 0.6 V.

The aforementioned decoder not only decodes the address signals to produce the signals for selecting the word/data lines of the memory cells but also perform amplification. Specifically, as shown in FIG. 2, the decoder output signals have a high level of −0.8 V like the high level of the ECL input signals and the output signals of the input buffer, but the low level is increased to −2.5 V in its absolute value. This increase is intended to correspond to the operating voltage of the memory cells, as will be described hereinafter. If the memory cell operating voltage VEM is increased, the read signals are accordingly amplified to give an advantage in the high-speed reading operation.

Figure 3:
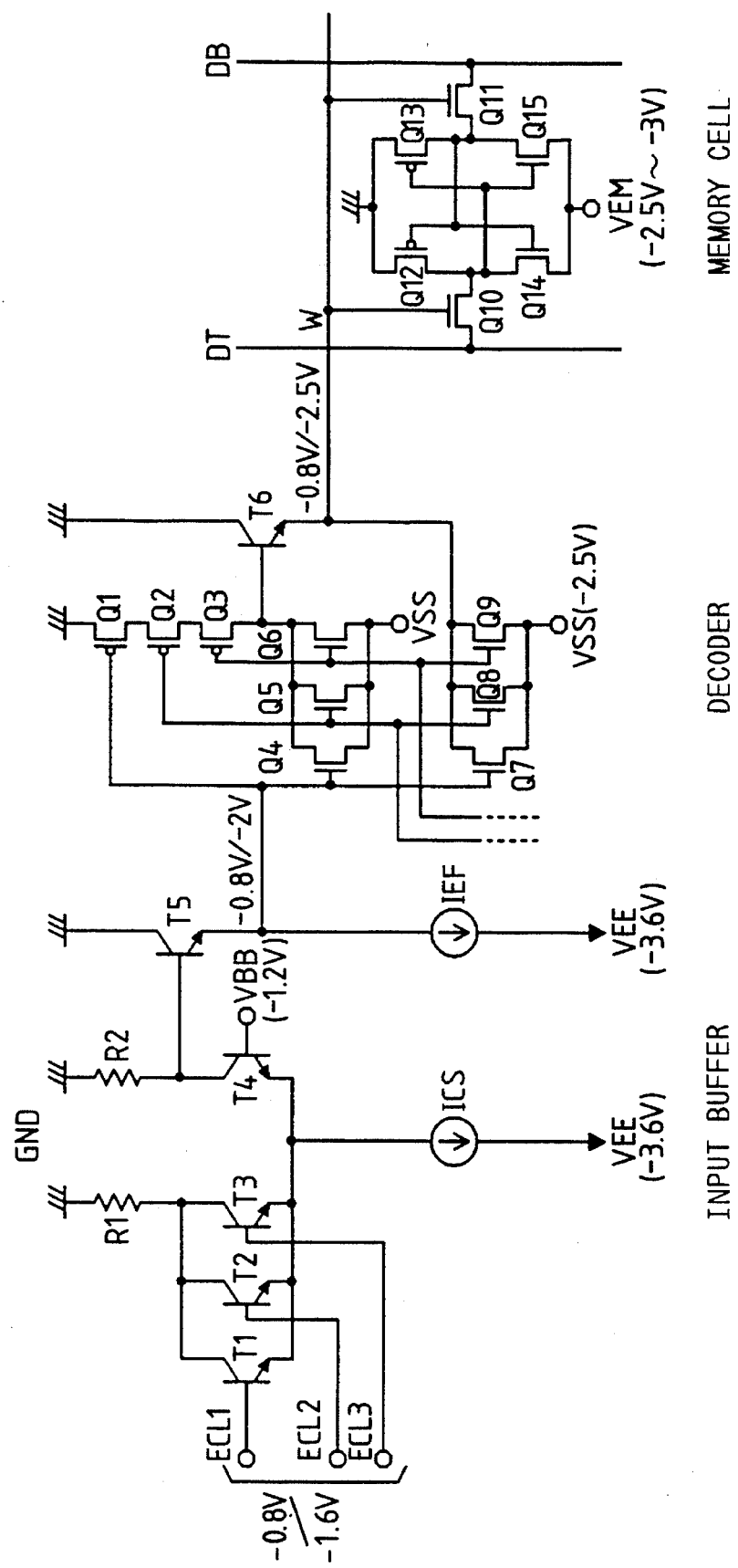
FIG. 3 is a schematic circuit diagram showing an embodiment of an input buffer, a decoder and a memory cell.

FIG. 3 is a concrete circuit diagram showing an embodiment of the aforementioned input buffer, decoder and memory cell shown in FIG. 2. In FIG. 3 the p-channel MOSFETs are discriminated from the n-channel MOSFETs by circling their gates. In the following description, the symbols attached to the circuit elements such as the transistors or MOSFETs are partially overlapped with those of other Figures so as to prevent the illustrations from being complicated, but it should be understood that the circuit elements have different circuit functions even if they have the same symbols.

Input signals ECL1 to ECL3 are of the ECL levels. In this embodiment, the input buffer is additionally given a logic function, i.e., a predecoding function, although not especially limited thereto. The input signals ECL1 to ECL3 are supplied to the bases of NPN bipolar transistors T1 to T3 connected in parallel. There is provided an NPN bipolar transistor T4 which is of a differential form with respect to these parallel transistors T1 to T3. The base of the transistor T4 is supplied with the reference voltage VBB corresponding to the input level.

Load resistors R1, R2 are connected to the collectors of the parallel transistors T1 to T3 and the collector of the transistor T4, respectively. Moreover, the common emitters of the differential transistors T1 to T4 are connected to a constant current source ICS. The input buffer of this embodiment has a circuit structure similar to that of the ECL circuit, but the output signal (ICS×R1) or (ICS×R2) generated by the constant current source ICS and the resistors R1 and R2 has a higher level than the ordinary ECL level on condition that the transistor T4 will not operate in the saturation region. In other words, the output signal is set to a relatively high level at which a later-described CMOS circuit is directly driven. Incidentally, the CMOS circuit is one in which the gates of the p-channel MOSFETs and the n-channel MOSFETs are coupled to each other, and thereby, the CMOS circuit can operate complementarily in response to the input signals supplied to the commonly coupled gates of the p-channel MOSFETs and the n-channel MOSFETs.

Thus, the reference voltage VBB corresponding to the aforementioned ECL levels of −0.8/−1.6 V is set to −1.2 V, and the collector voltage (ICS×R2) is so set to the maximum voltage of −1.2 V that the transistor T4 can maintain its operation in the unsaturation region.

Out of the output signals produced by the collector resistors R1 and R2 of the current switch circuit including the aforementioned differential transistors T1 to T4, the collector output signal of the transistor T4 is outputted through an emitter-follower circuit comprising an emitter-follower transistor T5 and a constant current source IEF. As a result, the output signals VOH/VOL of the input buffer are set from 0/−1.2 V to −0.8/−2 V by the level shifting action of the emitter-follower circuit. The input buffer is operated by the power source voltage VEE which is dropped to −3.6 V for power consumption induction.

The decoder is so constructed as to include a CMOS circuit and a Bi-CMOS circuit having bipolar transistors as its output elements. The output signal of the aforementioned input buffer is supplied to one input terminal of the three-input CMOS NAND gate which comprises p-channel MOSFETs Q1 to Q3 and n-channel MOSFETs Q4 to Q6, although not especially limitative thereto. The remaining two input terminals are supplied with the output signals of the input buffers acting pre-decoders, as described above. The output signal of this CMOS NAND is supplied to the base of an NPN bipolar output transistor Q6 for generating an output signal of the high level side. On the emitter side of the transistor T6, there are provided parallelly-connected n-channel MOSFETs Q7 to Q9 whose gates are supplied with the output signal of the aforementioned input buffer.

The aforementioned decoder is operated by the internal voltage VSS which is smaller in its absolute value than the power source voltage VEE of the input buffer. This operating voltage VSS is set to such a lower voltage of −2.5 V than the low-level output signal VOL coming from the input buffer as can turns off the n-channel MOSFETs Q4 to Q9. In other words, the difference between the voltage of the low-level output signal VOL coming from the input buffer and supplied to the gates of the n-channel MOSFETs and the operating voltage VSS supplied to the sources of the n-channel MOSFETs is set to the threshold voltage or lower of the n-channel MOSFETs. As a result, the n-channel MOSFETs Q4 to Q9 can be turned off by the low-level output signal VOL of the input buffer even if they have a threshold voltage of 0.6 V.

On the contrary, the p-channel MOSFETs are given higher threshold voltages than those of the n-channel MOSFETs Q4 to Q9 so that they may be substantially turned off by the aforementioned high level of −0.8 V. However, the high level of the output signal of the decoder is outputted through the transistor T6, and the p-channel MOSFETs Q1 to Q3 should retain the base current of the transistor T6. As a result, there is no substantial problem even if the current driving ability of the p-channel MOSFETs drops by raising their threshold voltages to relatively high levels.

The decoder generates the output of high level by its bipolar transistor T6 and accordingly the memory cell selecting signal (i.e., the signal for selecting a word line W, as shown) having a high level of −0.8 V and a low level of −2.5 V corresponding to the operating voltage VSS.

The memory cell is so constructed as to include: a CMOS latch, in witch two CMOS inverters comprising p-channel MOSFETs Q12 and Q13 and n-channel MOSFETs Q14 and Q15 are interconnected with each other; and address selecting n-channel transmission gate MOSFETs Q10 and Q11 connected between the input/output nodes of the CMOS latch and complementary data lines DT and DB. The memory cell is operated by both the ground potential GND of the circuit and the voltage VEM which is produced in the inside. This voltage VEM is so set as to be the same voltage as that of the aforementioned decoder or so set the difference from the VSS is within the threshold voltage of the MOSFETS. As a result, the voltage VEM is set to about −2.5 V to −3 V in correspondence with the above-specified voltage levels.

The memory cell of this embodiment is a memory cell of complete CMOS structure but can be one which uses high-resistance loads comprising polycrystalline silicon layers and so forth in place of the p-channel MOSFETs Q12 and Q13. These high-resistance loads are made to have a high resistance to pass such a small current that the storage levels stored in the gates of the n-channel MOSFETs Q14 and Q15 does not lose by the drain leakage currents of the transistors Q14 and Q15. Therefore, the high-resistance loads is different in meaning from those of the loads of an ordinary ratio inverter. When such high-resistance loads are used, the size (or occupied area) of the memory cells can be drastically reduced. If, however, the operating voltage VEM at the low level side of the memory cell is set to −2.5 V to −3 V, the operation of the memory cells could be unstable. Thus, it is preferable to use complete CMOS memory cells.

By adopting such a structure, as will be understood from the waveform chart of FIG. 2, the selecting operation of the memory cells of the CMOS structure can be carried out by the ECL level input signals without any level conversion and by the remarkably simple structure. As a result, even the ECL circuit such as the input buffer can be used at the low voltage of −3.6 V near the lower limit voltage. Thus, it is possible to reduce the power consumption at the ECL circuit side occupying most of the current consumption.

Figure 4:
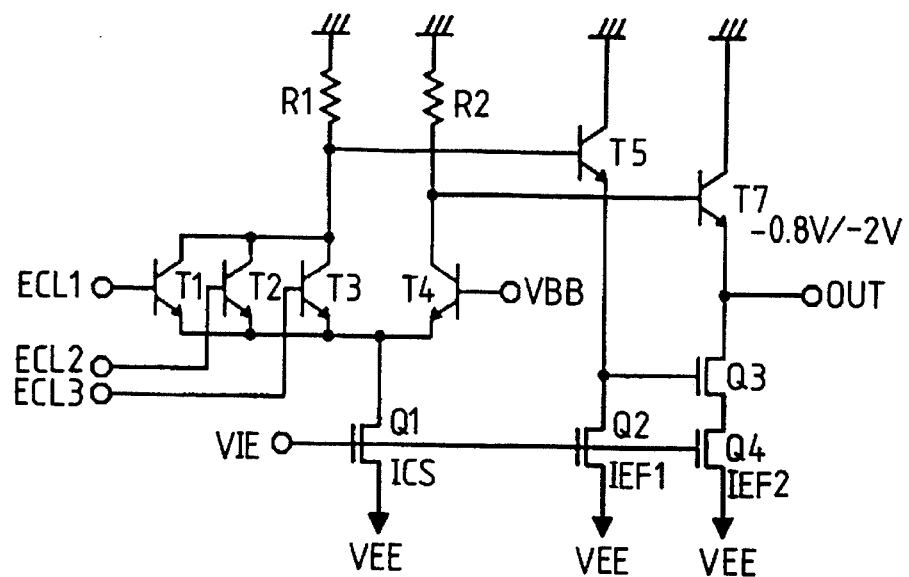
FIG. 4 is a circuit diagram showing another embodiment of the input buffer.

FIG. 4 is a circuit diagram of another embodiment of the aforementioned input buffer. In this embodiment, the complementary signals comprising the inverted and non-inverted output signals generated by the load resistors R1 and R2 of the differential transistor circuit comprising the differential transistors T1 to T4 and acting as the current switching circuit and are individually supplied to the bases of NPN emitter-follower bipolar transistors T5 and T7. The emitters of these emitter-follower transistors T5 and T7 are equipped with MOSFETs Q2 and Q4 constituting constant current sources IEF1 and IEF2 as individual loads. The emitter-follower output signal corresponding to the inverted output signal of the differential transistor circuit is supplied to the gate of the active pull-down n-channel MOSFET Q3 which is connected between the emitter-follower output transistor T7 and the constant current source IEF2.

By this structure, the rise of the output signals of the input buffer can be accelerated. The reason is that, when the output signal of the input buffer changes from the low level to the high level, the n-channel MOSFET Q3 is turned off, so that the whole emitter current of the transistor T7 can be used to charge up the input of the decoder or the capacitative load from the low level to the high level.

Figure 5:
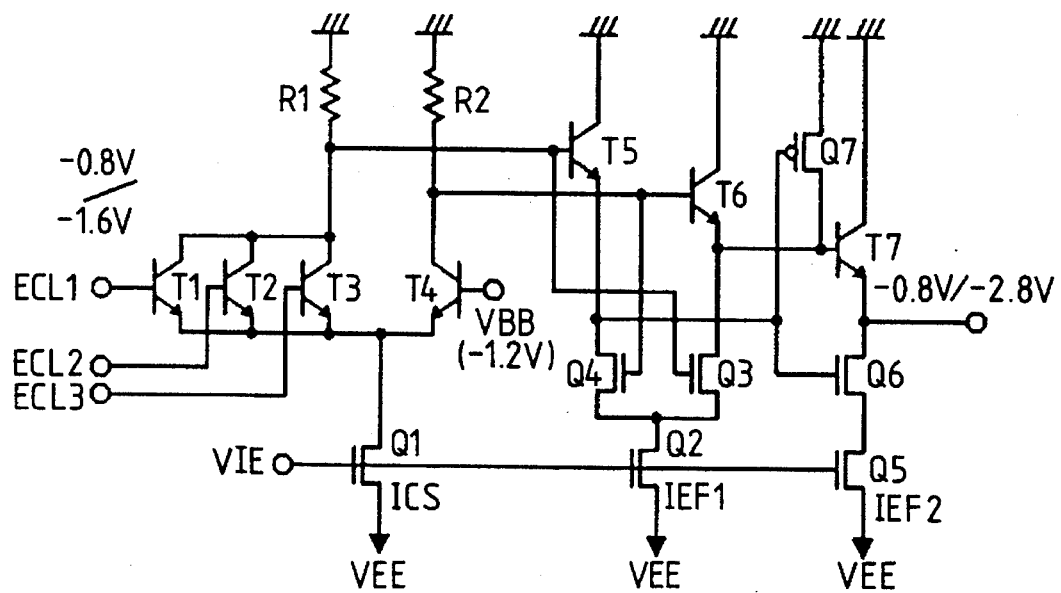
FIG. 5 is a circuit diagram showing still another embodiment of the input buffer.

FIG. 5 is a circuit diagram showing still another embodiment of the aforementioned input buffer. The paired NPN emitter-follower bipolar transistors T5 and T6 for receiving the complementary output signals of the differential transistor circuit generate complementary output signals corresponding to the complementary output signals of the differential transistor circuit supplied to the bases thereof. Taking up this signal generation as an advantage, in order to simplify the circuit and reduce the current consumption, the differential switch MOSFETs Q3 and Q4 are provided so that the MOSFET Q2 constituting the constant current source IEF1 shared by the two emitter-follower transistors T5 and T6 is used. The differential switch MOSFETs Q3 and Q4 are complementarily switched on/off since their gates are supplied with the input signals which are supplied to the bases of the opposite emitter-follower transistors T6 and T5.

For example, if the inverted output of the differential transistor circuit is of the high level, and the non-inverted output signal is of the low level, the switch MOSFET Q3, which is connected to the source of the emitter-follower transistor T6 receiving the low-level output signal, is turned on by the high level of the inverted output signal to feed the constant current produced by the MOSFET Q2 to the transistor T6 thereby to produce an output signal of the low level. At this time, the switch MOSFET Q4, which is connected to the emitter of the emitter-follower transistor T5 corresponding to the high level of the inverted output signal, is turned off by the aforementioned low-level non-inverted output signal. Thus, the emitter current of the emitter-follower transistor T5 wholly flows as the base current of the output transistor Q6, so that the charging current of the word line W increases to accelerate its fall.

On the contrary, if the inverted output signal of the differential transistor circuit is of low-level and the non-inverted output signal is of a high level, the switch MOSFET Q4, which is connected to the emitter of the emitter-follower transistor T5 receiving the low-level output signal, is turned on by the high level of the non-inverted output signal to feed the aforementioned constant current IEF1 to the transistor T5 thereby to produce an output signal of the low level. In short, the MOSFET Q6 of the output stage is quickly turned off whereas the p-channel MOSFET Q7 is turned on by the constant current IEF1. At this time, the switch MOSFET Q3, which is connected to the emitter of the transistor T6 corresponding to the high level of the non-inverted output signal, is turned off by the aforementioned low-level inverted output signal.

As a result, the emitter current of the emitter-follower transistor T6 can be wholly used as the base current of the NPN bipolar output transistor T7, so that the rise of the word line W can be quickened. In accordance with the ON state of the MOSFET Q7, moreover, the base potential of the transistor T7 finally becomes the ground potential of the circuit, so that the high level VOH of the output signal can be set to −0.8 V although the output stage is constructed of the two stages of emitter-follower circuits. Moreover, the low level of the output signal is set to as low as −2.8 V because it is outputted through the two emitter-follower circuits connected in cascade.

Even if the power source voltage VEE is set to −3.6 V and the low level of the output signal of the input buffer is set to −2.8 V, the switch MOSFET Q6 and the constant current source MOSFET Q5 can be operated because a voltage of about 0.8 V is applied to the series circuit of the active pull-down MOSFET Q6 and the MOSFET Q5 constituting the constant current source.

Incidentally, the MOSFET Q5 may be used commonly for a plurality of word lines. By using this MOSFET Q5 commonly for the word lines of the memory array, the MOSFET Q6 corresponding to the word line changing from the high level to the low level and a similar MOSFET corresponding to the other word line held in the non-selected state constitute a differential structure. As a result, only the n-channel MOSFET Q6 corresponding to the word line changing from the high level to the low level is substantially turned on, so that the word lines are quickly extracted by the constant current which is produced by the MOSFET Q5 acting as the common constant current source. When the word lines are extracted to a predetermined low level, the constant current produced by the MOSFET Q5 is made to flow dispersedly in the output transistor T6 corresponding to the non-selected word line.

Figure 6:
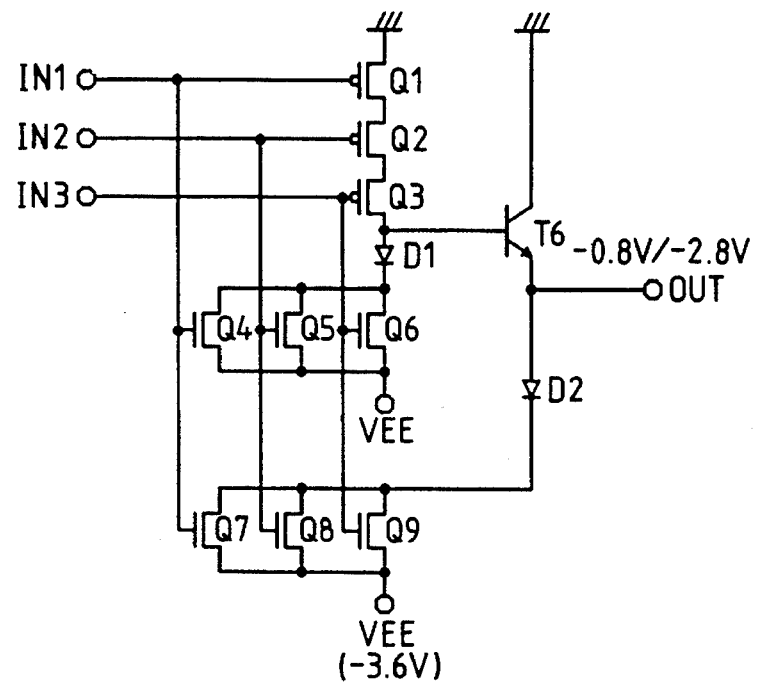
FIG. 6 is a circuit diagram showing another embodiment of the decoder.

FIG. 6 is a circuit diagram of another embodiment of the decoder. In this embodiment, the decoder is apparently supplied as its operating voltage with the same voltage VEE as that of the input buffer. The power source voltage VEE at this time is −3.6 V. In order to set the output signals of the decoder to −0.8/−2.8 V, on the other hand, a level shifting diode D1 is connected between the output terminal and the drains of the parallel n-channel MOSFETs Q4 to Q6 of the CMOS circuit which is disposed at the base of the NPN bipolar output transistor T6. Likewise, a level shifting diode D2 is connected between the emitter of the output transistor T6 and the drains of the parallel n-channel MOSFETs Q7 to Q9 for generating the low level output signals.

By adopting such a structure described above, the decoder can be operated without providing any special power source circuit which will be described hereinafter. As a result of incorporating the aforementioned diodes D1 and D2, both the low-level input signal inputted to the base of the output transistor T6 and the low-level output signals produced in accordance with the ON states of the output MOSFETs Q7 to Q9 increase in level by a value of 0.8 V corresponding to the forward voltages of the diodes D1 and D2, so that the low level VOL of the output signals can be set to −2.8 V. The diodes D1 and D2 used can be PN junction diodes or an NPN bipolar transistors with their bases and collectors connected to each other.

Figure 7:
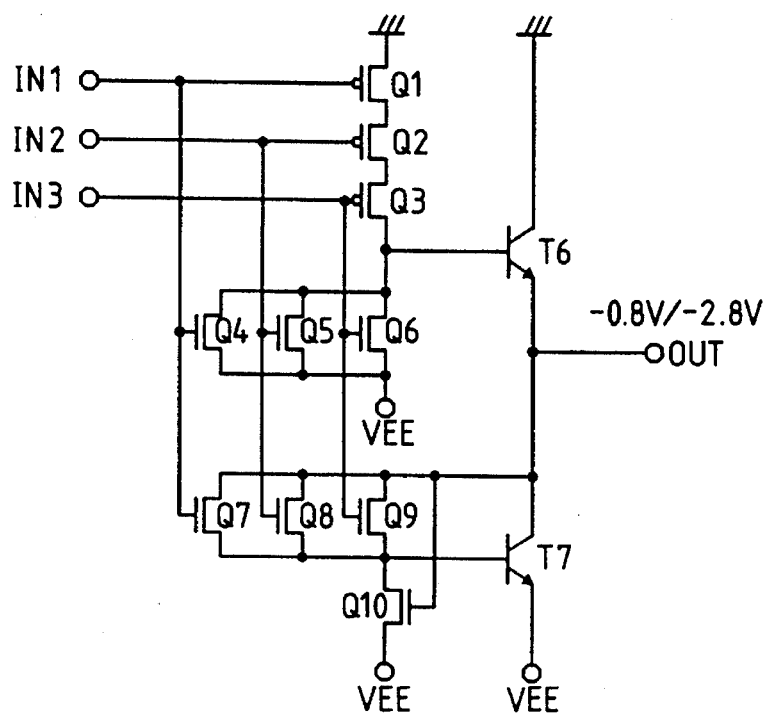
FIG. 7 is a circuit diagram showing another embodiment of the decoder.

FIG. 7 is a circuit diagram of another embodiment of the decoder. In this embodiment, too, the same voltage VEE as that of the input buffer is apparently supplied as the operating voltage of the decoder. The power source voltage VEE at this time is set to −3.6 V. In order to set the output signal of the decoder to −0.8/−2.8 V, on the other hand, the NPN bipolar transistor T7 is connected in cascade to the emitter of the NPN bipolar output transistor T6. Between the base and collector of that transistor T7, there are connected parallelly n-channel MOSFETs Q7 to Q9 whose gates are connected to input terminals IN1 to IN3 respectively. Between the base and emitter of the transistor T7, there is connected an n-channel MOSFET Q10 whose gate is supplied with the output signal. Since the low-level output signal is produced by using such an output transistor T7, the power source voltage VEE is raised by a value of 0.8 V corresponding to the base-emitter voltage, so that the low level VOL of the output signal can be set to −2.8 V. Since the output circuit can be composed of transistors as described above, the rise of the high/low levels of the output signals can be accelerated.

Figure 8:
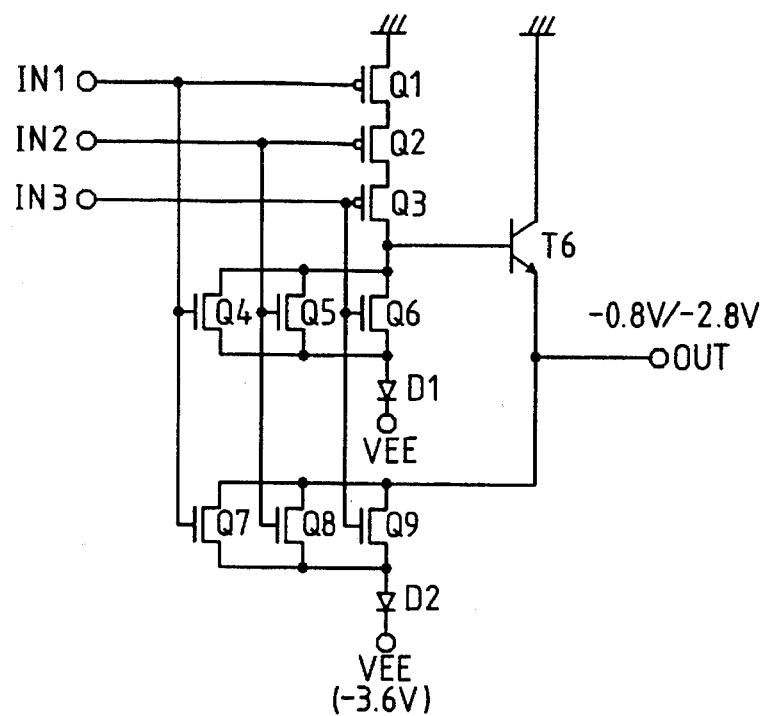
FIG. 8 is a circuit diagram showing another embodiment of the decoder.

FIG. 8 is a circuit diagram of another embodiment of the decoder. In this embodiment, too, the same voltage VEE as that of the input buffer is apparently supplied as the operating voltage of the decoder. The power source voltage VEE at this time is set to −3.6 V. In order to set the output signals of the decoder to −0.8/−2.8 V, on the contrary, the diodes D1 and D2 are connected between the sources of the n-channel MOSFETs Q4 to Q6 of the CMOS circuit for driving the NPN bipolar output transistor T6 and the power source voltage VEE and between the sources of the parallelly connected n-channel MOSFETs Q7 to Q9 for producing the low-level output signals and the power source voltage VEE.

Figure 9:
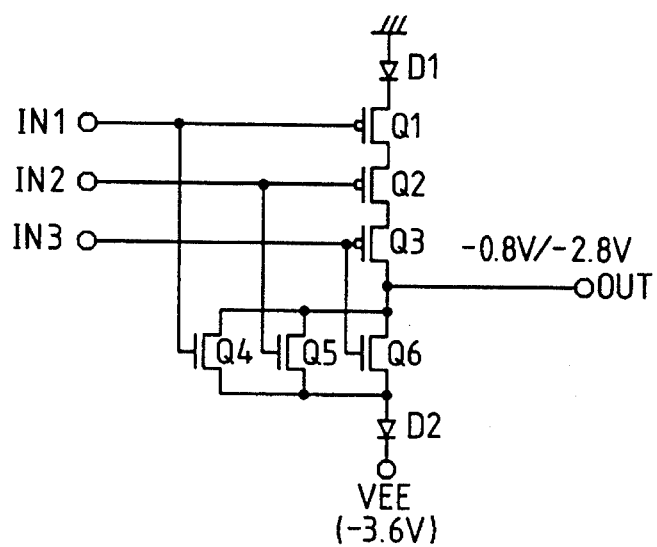
FIG. 9 is a circuit diagram showing still another embodiment of the decoder.

FIG. 9 is a circuit diagram of still another embodiment of the decoder. In this embodiment, too, the same voltage VEE as that of the input buffer is apparently supplied as the operating voltage of the decoder. The power source voltage VEE at this time is set to −3.6 V. On the contrary, the decoder is constructed of a CMOS circuit. The ground potential of the circuit is supplied through the diode D1 to the p-channel side circuit whereas the power source voltage VEE is supplied through the diode D2 to the n-channel side circuit. As a result, the output signals of the CMOS circuit can be set to −0.8/−2.8 V.

Figure 10:
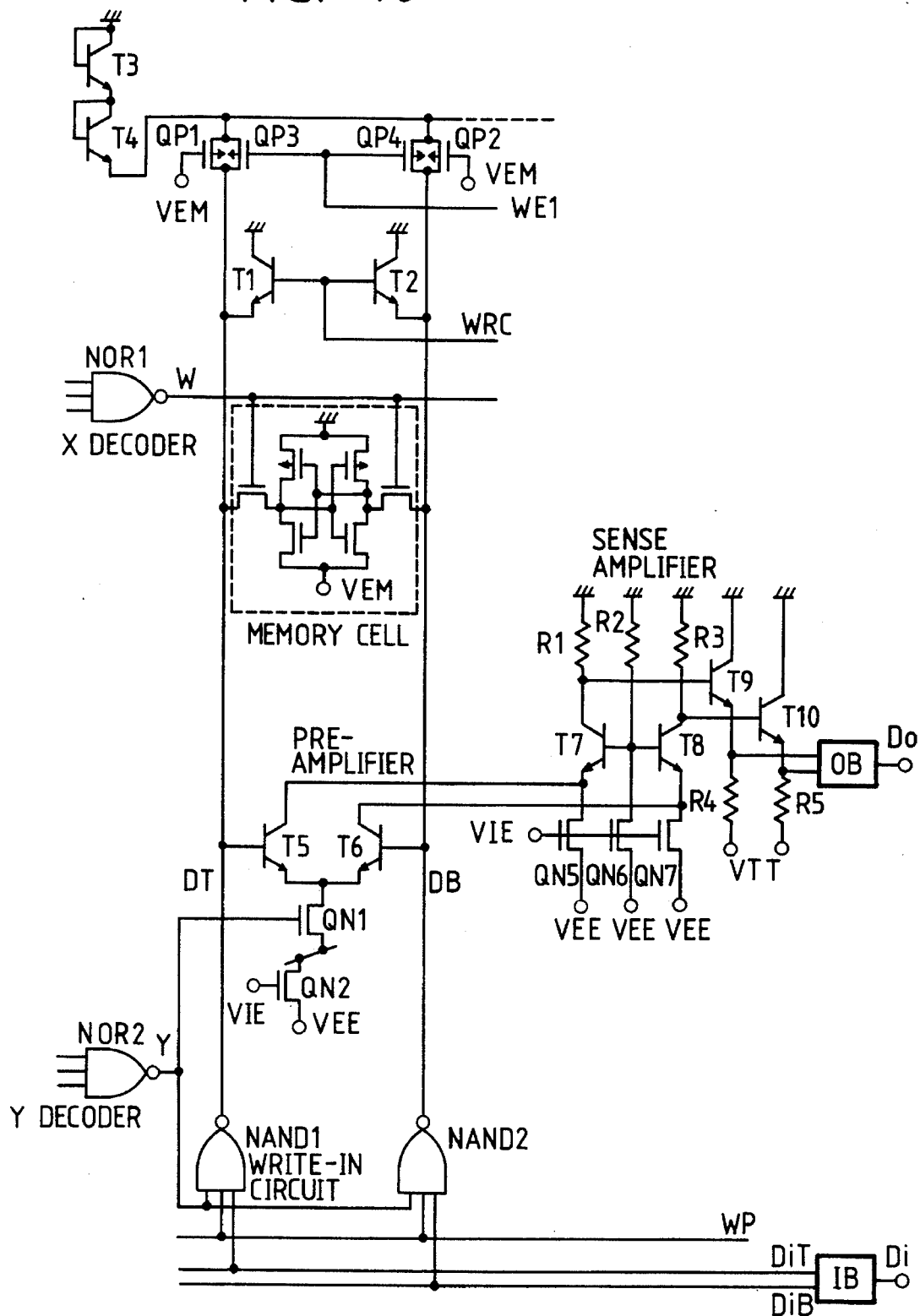
FIG. 10 is a circuit diagram showing an embodiment of a memory array section of a static RAM and its peripheral circuit, to which the present invention is applied.

FIG. 10 is a circuit diagram of an embodiment of the memory array portion including the memory cells of FIG. 3 and the peripheral circuits of the same. In FIG. 10, there are shown, exemplarily, one word line W, one word line selector, one memory cell, a pair of complementary data lines DT and DB, its load circuit, a write recovery circuit, a preamplifier, a sense amplifier, an output circuit OB, a column switch circuit, a data input circuit IB and a write-in circuit.

The memory cell comprises, as shown in FIG. 3, a CMOS latch in which the inputs and outputs of two CMOS inverters composed of p-channel MOSFETs and n-channel MOSFETs cross interconnected; and an address selecting transfer gate MOSFET connected between the input/output nodes of the CMOS latch and the complementary data lines DT and DB. The high-level operating voltage of the memory cell is the ground potential of the circuit, and the low-level side operating voltage is the constant voltage VEM which is smaller in its absolute value than the power source voltage VEE. Since the low-level operating voltage VEM of the memory cell is set to about −3 V, a complete CMOS type memory cell is used, as shown.

The gates of the transfer gate MOSFETs of the memory cell are connected to the corresponding word lines. This word line W is driven by a word line selector NCR1 which is constructed of the foregoing decoders shown in FIGS. 3 to 9. It is possible to realize a circuit structure for selecting one of 64 word lines by producing eight types of output signals by the input buffer having the aforementioned three-input predecoding function and by using the three-input decoder.

The complementary data lines DT and DB are equipped with data line load means composed of p-channel MOSFETs QP1 and QP2. The conductances of these MOSFETs QP1 and QP2 are relatively low considering the writing characteristics, and their gates are supplied steadily with the constant voltage VEM. To the source-drain paths of these MOSFETs QP1 and QP2, there are connected in parallel the source-drain paths of p-channel MOSFETs QP3 and QP4 which have relatively high conductances.

These MOSFETs QP3 and QP4 are turned on in the operations other than the write-in operation when their gates are supplied with a write-in control signal WE1. In other words, the MOSFETs QP3 and QP4 together with the MOSFETs QP1 and QP2 constitute the data line loads during the read-out operation. During the read-out operation, the signal amplitude of the complementary data lines is restricted to realize high-speed read-out operation. During the write-in operation, on the other hand, the MOSFETs QP3 and QP4 having the relatively high conductances are turned off by the control signal WE1, and the loads for the complementary data lines DT and DB are composed of the MOSFETs QP1 and QP2 having the low conductances, so that the signal amplitude of the write data transmitted to the complementary data lines is enlarged to effect the write-in operation at a high speed.

The aforementioned load circuits are fed with bias voltages whose levels are shifted by the diode-connected NPN bipolar transistors T3 and T4. Specifically, the high level of the signal amplitudes of the complementary data lines DT and DB is dropped to a low potential of −2 VBE (wherein VBE designate a base-emitter voltage of the transistors). As a result, the signal amplitude of the complementary data lines DT and DB during the write-in operation is restricted to a low value, so that a high-speed write-in operation can be accomplished. Since the write-in operation of the memory cell is effected dominantly by the low level transmitted to the complementary data line DT or DB, there arises no problem even if the high level is dropped to −2 VBE as in this embodiment. Specifically, the gate potential of the memory MOSFET of the memory cell in the ON state is extracted and turned off by the potential of the complementary data line which is set to the low level through the transmission gate of the MOSFET, so that the memory MOSFET in the OFF state is turned on to perform the inversion write-in operation of the data.

The complementary data lines DT and DB are connected to the output terminals of NAND circuits NAND1 and NAND2 acting as a write-in circuit. The inputs of the NAND circuits NAND1 and NAND2 are supplied with a column select signal Y which is produced by a Y-decoder NOR2 constructed of a decoder like the aforementioned one. The other inputs of the NAND circuits NAND1 and NAND2 acting as a write-in circuit are supplied with complementary write-in signals DiT and DiB transmitted through a data input circuit IB, and a write-in pulse WP. The data input circuit IB has a specific structure similar to the aforementioned input buffers shown in FIGS. 3 to 5.

The complementary data lines DT and DB are connected to the bases of the NPN differential bipolar transistors T5 and T6 constituting a preamplifier. In short, this memory is of a column sense type. The common emitters of these differential transistors T5 and T6 are connected to an n-channel constant current MOSFET QN2 through an n-channel switch MOSFET QN1 receiving the column select signal Y. The gate of this constant current MOSFET QN2 is fed with a constant voltage VIE to produce a constant current. This constant current MOSFET QN2 is shared commonly by the preamplifier switch MOSFETs corresponding to the column address.

The collectors of the differential transistors T5 and T6 are connected to the inputs of a current/voltage converter constituting the sense amplifier. Specifically, the collectors of the transistors T5 and T6 are connected to the emitters of NPN bipolar transistors T7 and T8 for receiving at their bases the bias voltage produced by the resistor R2 through which flows a constant current produced by an n-channel MOSFET QN6 which receives the constant voltage VIE. Those transistors T7 and T8 are equipped at their emitters with n-channel constant current MOSFETs QN5 and QN7 which receive the constant voltage VIE and equipped at their collectors resistors R1 and R3 for the current/voltage conversions.

From the complementary data lines DT and DB the high/low level signals corresponding to the stored data of the memory cell selected are outputted. Upon receiving these high/low levels, the differential transistors T5 and T6 constituting the preamplifier are turned on/off. The constant current flows through the aforementioned resistor R1 or R3 and through the MOSFET QN1 turned on by the column select signal Y, depending on the ON/OFF states of the differential transistors. The read signal thus converted into a voltage signal by those resistors R1 and R3 is inputted to the output circuit OB through the emitter-follower circuit comprising NPN bipolar transistors T9 and T10 and emitter resistors R4 and R5. The output circuit OB is constructed of the ECL circuit and outputs an output signal Do of the ECL level.

The NPN bipolar transistors T1 and T2 constitute a write recovery circuit and is turned on by a recovery signal WRC produced at the end of the write-in operation to transmit the write-in signal WRC. Thereby the complementary data lines DT and DB the difference of potentials of which are relatively large are reset at a high speed. The recover signal WRC is outputted through the emitter-follower output transistors. Therefore, the complementary data lines DT and DB are set to the level equal to the bias level of −2 VBE corresponding to the bias circuit (of transistors T3 and T4) because the transistors T1 and T2 are Darlington-connected to the output transistors for producing the recovery signal WRC.

Figure 11:
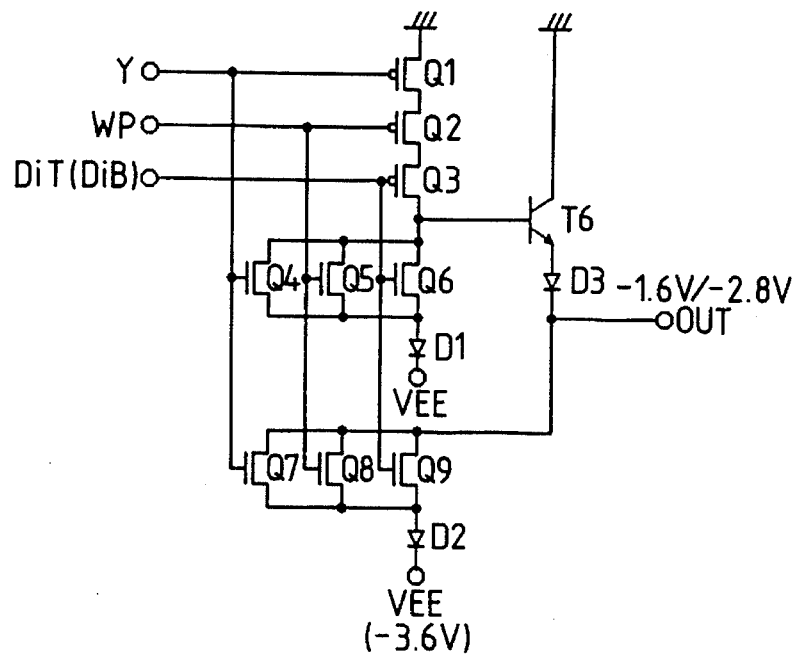
FIG. 11 is a circuit diagram showing an embodiment of a write-in circuit of FIG. 10.

FIG. 11 is a circuit diagram of one embodiment of the write-in circuit (of iNAND1 and NAND2) shown in FIG. 10. The circuit of FIG. 11 is a Bi-CMOS circuit similar to the aforementioned decoder shown in FIG. 8. The difference from the decoder of FIG. 8 is that a diode D3 is connected between the emitter of the NPN output bipolar transistor T6 and an output terminal OUT. As a result, the output signal of the write-in circuit has high/low levels of −1.6/−2.8 V. Moreover, the complementary write signal DiT (or DiB) from the data input circuit IB, the select signal Y and the write pulse WP are supplied as the input signals. This write-in circuit is constructed of a pair of circuits corresponding to the complementary data lines DT and DB. Of these, one circuit is representatively shown in FIG. 11.

Figure 12:
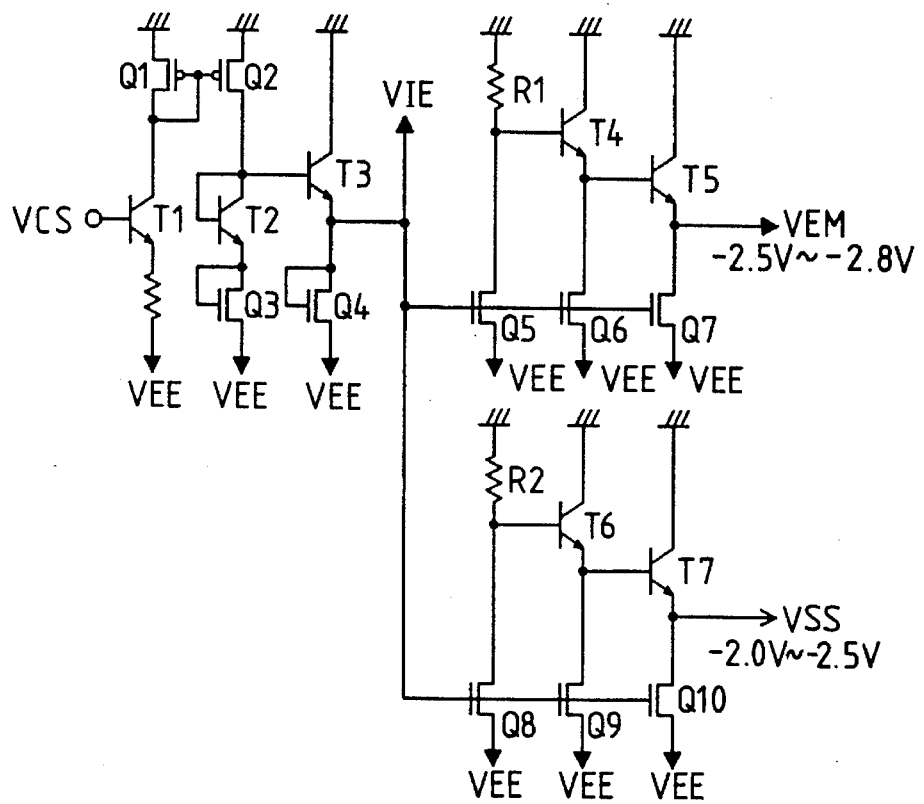
FIG. 12 is a circuit diagram showing an embodiment of an internal voltage generator for generating the operating voltage of an internal circuit.

FIG. 12 shows an embodiment of a generator for generating the constant voltage VIE and the operating voltages VSS and VEM of the internal circuit. The constant voltage VIE is a constant voltage supplied to the gate of the MOSFET acting as the aforementioned constant current source, and the constant voltages VSS and VEM are power source voltages for operating a Bi-CMOS circuit and CMOS circuit such as the decoder and the memory array.

A predetermined constant current is made to flow through a resistor by connecting the resistor to the emitter of the transistor T1 which receives the constant voltages VCS in the ECL circuit. This constant current is made to flow through the series circuit, which is composed of the transistor T2 and the n-channel MOSFET Q3 both connected in diode modes, by means of the p-channel MOSFETs Q1 and Q2 in current mirror modes. The transistor T2 in the diode mode constitutes a level shifter, and the constant voltage Vth corresponding to the threshold voltage of the MOSFET Q3 is outputted as the aforementioned constant voltage VIE through the emitter-follower output transistor T3.

The MOSFET Q4 in the diode mode is used as the load of the emitter-follower output transistor T3. In this structure, the constant voltage VIE corresponds to the threshold voltage Vth of the MOSFET Q1, so that the constant current according to the constant current produced by the aforementioned resistor R1 is produced in the n-channel MOSFETs Q5 to Q10 which receive this constant voltage VIE. For example, assume that the sizes of the p-channel MOSFETs Q1 and Q2 are equal to each other and the current produced by the resistor R1 is fed to the n-channel MOSFET Q3. If the sizes of the MOSFET Q3, Q5 to Q10 are equal to one another, the same current as that of the MOSFET Q3, that is, the constant current flowing through the resistor R1 is fed to these MOSFETs Q5 to Q10.

The sizes of the MOSFET Q5 and so forth in FIG. 12 can be made a little larger than that of the MOSFET Q3 to produce a current increased by the size ratio and thereby to produce the operating voltage VEM of about −2.5 to 2.8 V which is larger in its absolute value than the low level VOL (of −2.0 V) of the input buffer. The sizes of the MOSFET Q8 and so forth can be made a little larger than that of the MOSFET Q3 to produce a current increased by the size ratio and thereby to produce the operating voltage VSS of about −2.5 to 2.8 V which is larger in its absolute value than the low level VOL (of −2.0 V) of the input buffer.

Figure 13:
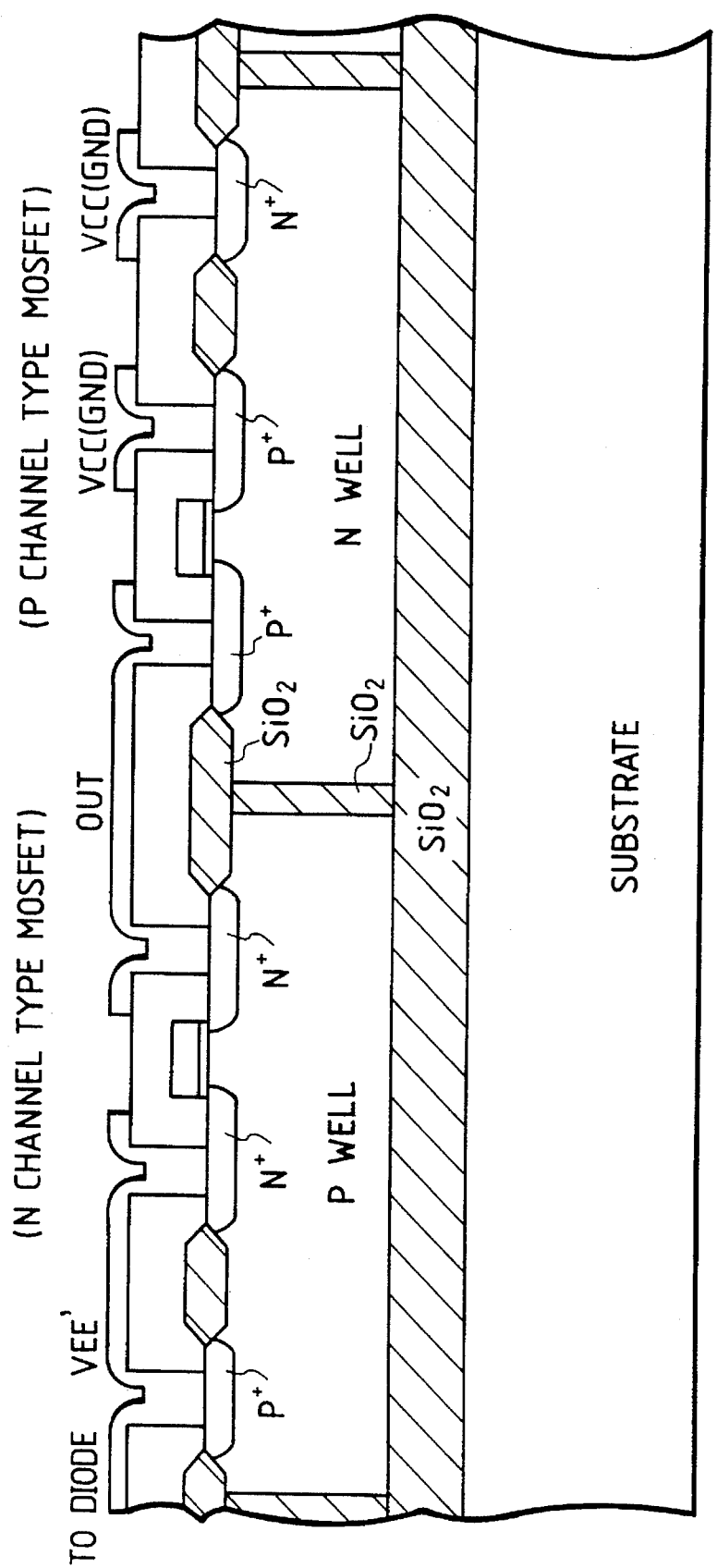
FIG. 13 is a section of an element structure of an embodiment of a CMOS circuit when the operating voltage is applied through a diode, as shown in FIG. 8 or 11.

FIG. 13 is a section of an element structure of an embodiment of the CMOS circuit when the operating voltage is supplied through a diode as shown in FIG. 8 or 11. When the operating voltage is supplied through the level shifting diode to the sources of the n-channel MOSFETs as shown in FIG. 8 or 11, the threshold voltage of the n-channel MOSFETs is increased by the body effect if the substrate is supplied with the power source voltage such as VEE.

In this embodiment, the n-well and the p-well where the p-channel MOSFETs and the n-channel MOSFETs are formed are isolated by means of an insulator (e.g., $SiO_2$). By adopting this isolation method, the source of the n-channel MOSFET and the p-well of the substrate are supplied with a power source voltage VEE' through a diode. As a result, the body effect is not produced in the n-channel MOSFET. Incidentally, the section of the element structure of the CMOS circuit of FIG. 13 can be adopted to the case in which the memory cell of FIG. 10 is formed over a semiconductor substrate. In this case, the voltage VEE' is changed into the voltage VIE.

In the p-channel MOSFET, too, when the ground potential of the circuit is supplied through the level shifting diode as shown in FIG. 9, the n-well and the source of the p-channel MOSFET can be commonly connected with the diode so that no influence of the body effect is not produced.

The effects brought about by the embodiments are as follows.

(1) The input signal of ECL level is received by the input buffer for amplifying output signal levels within a range where the differential transistors operates in an unsaturation region, and the output signals is supplied to a CMOS circuit or Bi-CMOS circuit which is operated by both the operating voltage having a smaller absolute value than that of the operating voltage of the input buffer and the ground potential of the circuit. As a result, both the input buffer and the first-stage CMOS or Bi-CMOS circuit which receives the output signal of the input buffer perform signal transmission and level conversion, so that the high-speed operation and the low power consumption can be achieved by a simple structure.

(2) Thanks to the aforementioned effect (1), in the ECL circuit, the signal of the ECL level is received as they are, so that the operating lower limit voltage of the input buffer can be reduced, and the power consumption of the ECL interface unit such as the input buffer can be reduced.

(3) By application to a static RAM, the signal level can be stepwise increased between the input buffer and the decoder or between the input buffer and the write-in circuit. As a result, the operating voltage on the memory cell side can be increased to a relatively high level to stabilize the data holding operation and to maintain the high-speed reading operation.

(4) When the power source voltage is set to about −3.6 V corresponding to the lower limit voltage of the ECL circuit whereas the operating voltage of the internal circuit is set to about 2.8 V, the power source circuit can be simplified by shifting the level of the power source voltage by use of the threshold voltages of the transistors or the MOSFETs and by using the level-shifted voltage as the operating voltage of the internal circuit.

Although our invention has been specifically described in connection with the embodiments thereof, it should not be limited to the foregoing embodiments but can naturally be modified in various manners without departing from the gist thereof. For example, the signal levels can be set to various levels in connection with the lower limit operating voltage of the CMOS circuit or Bi-CMOS circuit constituting the internal circuit, on condition that the differential transistors constituting the input buffer operate in the unsaturation region. The internal circuit can be a logic circuit of a CMOS circuit or a Bi-CMOS circuit.

The present invention can be widely applied to a variety of semiconductor integrated circuit devices which have ECL interfaces and whose have internal circuit is constructed of a CMOS or a Bi-CMOS circuit.

The effects obtainable from the representative of the invention disclosed herein will be briefly described below. The input signal of ECL level is received by an input buffer for amplifying the output signal level within a range where the differential transistors operate in an unsaturation region, and the output signal is supplied to a CMOS circuit or Bi-CMOS circuit which is operated by both the operating voltage having a smaller absolute value than that of the operating voltage of the input buffer and the ground potential of the circuit. As a result, both the input buffer and the first-stage CMOS or Bi-CMOS circuit which receives the output signal of the input buffer perform both signal transmission and level conversions, so that the high-speed operation and the low power consumption can be achieved by a simple structure.

What is claimed is:

1. A semiconductor integrated circuit device comprising:

a first circuit which includes:

a first transistor which has a first base supplied with a first input signal having a first voltage range between high and low voltage levels of said first input signal, a first emitter and a first collector, wherein the first input signal is an ECL level signal;

a second transistor which has a second emitter coupled to the first emitter, a second collector and a second base supplied with a reference voltage corresponding to the first input signal;

a third transistor which has a third base coupled to the second collector, a third emitter and a third collector, and which outputs a first output signal in response to a collector potential of the second collector, wherein the first output signal has a second voltage range between high and low voltage levels of said first output signal which is wider than the first voltage range of the first input signal;

a first ground terminal which is supplied with a ground potential and which is coupled to the first, second and third collectors; and a first power supply terminal which is supplied with a first operating voltage and which is coupled to the first, second and third emitters, wherein a level of the first operating voltage is set to prevent operation of the first and second transistors in their saturation regions, a second circuit which decodes the first output signal and which outputs a second output signal having a third voltage range between high and low voltage levels of said second output signal which is wider than the second voltage range of said first output signal, wherein the second circuit is coupled between a second ground terminal supplied with the ground potential and a second power supply terminal supplied with a second operating voltage of a higher level than the first operating voltage; and a memory array which includes:

a plurality of memory cells each including complementary MOSFETs; and a plurality of word lines which are coupled to the memory cells, and in which a word line is selectively selected in response to the second output signal, and wherein each of the memory cells is coupled between a third ground terminal supplied with the ground potential and a third power supply terminal supplied with a third operating voltage having an absolute value thereof being larger than an absolute value of a low level voltage of the second output signal.

2. A semiconductor integrated circuit device comprising:

a first circuit which includes:

a first transistor which has a first base supplied with a first input signal having a first voltage range between high and low voltage levels of said first input signal, a first emitter and a first collector, wherein the first input signal is an ECL level signal;

a second transistor which has a second emitter coupled to the first emitter, a second collector and a second base supplied with a reference voltage corresponding to the first input signal;

a third transistor which has a third base coupled to the second collector, a third emitter and a third collector, and which outputs a first output signal in response to a collector potential of the second collector, wherein the first output signal has a second voltage range between high and low voltage levels of said first output signal which is wider than the first voltage range;

a first ground terminal which is supplied with a ground potential and which is coupled to the first, second and third collectors; and a first power supply terminal which is supplied with a first operating voltage and which is coupled to the first, second and third emitters, wherein a level of the first operating voltage is set to prevent operation of the first and second transistors in their saturation regions, a second circuit which includes:

a fourth transistor which has a fourth base supplied with a second input signal having a voltage range between high and low voltage levels of the second input signal which is substantially the same as said first voltage range, a fourth emitter and a fourth collector, wherein the second input signal is an ECL level signal, a fifth transistor which has a fifth emitter coupled to the fourth emitter, a fifth collector and a fifth base supplied with a reference voltage corresponding to the second input signal;

a sixth transistor which has a sixth base coupled to the fifth collector, a sixth emitter and a sixth collector, and which outputs a second output signal in response to a collector potential of the fifth collector, wherein the second output signal has a voltage range between high and low voltage levels of said second output signal which is substantially the same as said second voltage range and which is wider than the first voltage range;

a second ground terminal which is supplied with the ground potential and which is coupled to the fourth, fifth and sixth collectors; and a second power supply terminal which is supplied with the first operating voltage and which is coupled to the fourth, fifth and sixth emitters, wherein a level of the first operating voltage is so set to prevent operation of the fourth and fifth transistors in their saturation regions, a third circuit which decodes the first and second output signals and which outputs a third output signal having a third voltage range between high and low voltage levels of said third output signal, which third voltage range is wider than the second voltage range, wherein the third circuit is coupled between a third ground terminal supplied with the ground potential and a third power supply terminal supplied with a second operating voltage of a higher level than the first operating voltage; and a memory array which includes:

a plurality of memory cells including complementary MOSFETs, and a plurality of word lines which are coupled to the memory cells, and in which a word line is selectively selected in response to the third output signal, and wherein each of the memory cells is coupled between a fourth ground terminal supplied with the ground potential and a fourth power supply terminal supplied with a third operating voltage having an absolute value thereof being larger than an absolute value of a low level voltage of the third output signal.

3. A semiconductor integrated circuit device according to claim 2, further comprising a diode element which is coupled between the decoder circuit and the second power supply terminal in order to supply the second power supply terminal with the first operating voltage instead of supplying it with the second operating voltage.

4. A semiconductor integrated circuit device according to claim 3, wherein the second power supply terminal is coupled to the first power supply terminal.

5. A semiconductor integrated circuit device according to claim 2, wherein a voltage difference between the absolute value of second operating voltage and that of the third operating voltage is lower than a threshold voltage of a MOSFET of at least one of the complimentary MOSFETs forming said memory cells.

6. A semiconductor integrated circuit device according to claim 5, further comprising a first load resistor coupled between the first ground terminal and the collector of the first transistor, and a second load resistor coupled between the first ground terminal and the collector of the second transistor.

7. A semiconductor integrated circuit device according to claim 6, further comprising a first constant current source circuit coupled between the first power supply terminal and the emitters of the first and second transistors, and a second constant current source circuit coupled between the first power supply terminal and the emitter of the third transistor.

8. A semiconductor integrated circuit device according to claim 7, further comprising a seventh transistor coupled to the first transistor in parallel, which has a seventh base supplied with a third input signal having voltage range between high and low voltage levels of said third input signal which is substantially the same as said first voltage range, where the third input signal is an ECL level signal.

9. In a semiconductor integrated circuit device having an input buffer circuit, a decoder circuit which receives output signals from the input buffer circuit and a memory array coupled to the decoder circuit, wherein the input buffer circuit includes:

a differential circuit which receives a first input signal having a first voltage range between high and low voltage levels of said first input signal and a reference voltage corresponding to the first input signal, and which has a first transistor and a second transistor coupled in a differential form, wherein the first input signal is an ECL level signal;

an emitter-follower circuit which has a third transistor outputting a first output signal, as one of the output signals of the input buffer circuit, in response to an output signal outputted from the differential circuit, wherein the first output signal has a second voltage range between high and low voltage levels of said first output signal which is wider than the first voltage range;

a first ground terminal which is supplied with a ground potential and which is coupled to the differential circuit and the emitter-follower circuit; and a first power supply terminal which is supplied with a first operating voltage and which is coupled to the differential circuit and the emitter-follower circuit, wherein a level of the first operating voltage is set to prevent operation of the first and second transistors in their saturation regions, wherein the decoder circuit decodes the output signals from the input buffer circuit and outputs a second output signal having a third voltage range between high and low voltage levels of said second output signal which is wider than the second voltage range, and wherein the decoder circuit is coupled between a second ground terminal supplied with the ground potential and a second power supply terminal supplied with a second operating voltage of a higher level than the first operating voltage; and wherein the memory array includes:

a plurality of memory cells including complementary MOSFETs; and a plurality of word lines which are coupled to the memory cells, and in which a word line is selectively selected in response to the second output signal, and wherein each of the memory cells is coupled between a third ground terminal supplied with the ground potential and a third power supply terminal supplied with a third operating voltage having an absolute value thereof being larger than an absolute value of a low level voltage of the second output signal.

* * * * *